United States Patent
Chen et al.

(10) Patent No.: US 6,245,598 B1
(45) Date of Patent: Jun. 12, 2001

(54) METHOD FOR WIRE BONDING A CHIP TO A SUBSTRATE WITH RECESSED BOND PADS AND DEVICES FORMED

(75) Inventors: Tsung-Chieh Chen, Taipei; Chun-Liang Chen, Pingtung; Kuang-Ho Liao, Taipei, all of (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/305,945

(22) Filed: May 6, 1999

(51) Int. Cl.[7] .................. H01L 21/50; H01L 21/44; H01L 21/48; H01L 23/04; H01L 23/12

(52) U.S. Cl. .................. 438/126; 438/125; 438/617; 438/107; 257/698; 257/700; 257/786

(58) Field of Search .................. 438/126, 125, 438/617, 107, 118, 613, 612; 257/698, 700, 786, 687, 701, 784

(56) References Cited

U.S. PATENT DOCUMENTS

| | | | |
|---|---|---|---|
| 5,137,846 | * | 8/1992 | Machuga et al. .......... 437/211 |
| 5,243,756 | * | 9/1993 | Hamburgen et al. .......... 29/841 |
| 5,663,106 | * | 9/1997 | Karavakis et al. .......... 29/841 |

* cited by examiner

*Primary Examiner*—Wael Fahmy
*Assistant Examiner*—Neal Berezny
(74) *Attorney, Agent, or Firm*—Tung & Associates

(57) ABSTRACT

A method for forming chip scale packages and devices formed by utilizing a wire bonding technique and an interposer board which has recessed peripheral regions are disclosed. In the method, an IC die is bonded on its active surface to an interposer which is constructed with a recessed peripheral regions equipped with interconnections such that shorter bond wires may be run between the IC die and the interposer. The interposer is further equipped, in a top planar surface, with a plurality of interconnections for the subsequently forming of solder balls for connecting to an outside circuit such as a printed circuit board. The present invention novel method further provides the benefit that the shorter wire bonds formed alleviate the wire sweep problem normally occurs in the plastic encapsulation process for such a package.

8 Claims, 2 Drawing Sheets

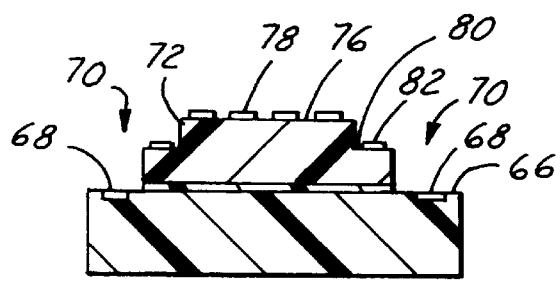
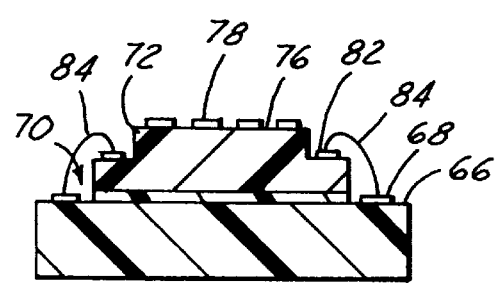
FIG. 4B        FIG. 4C
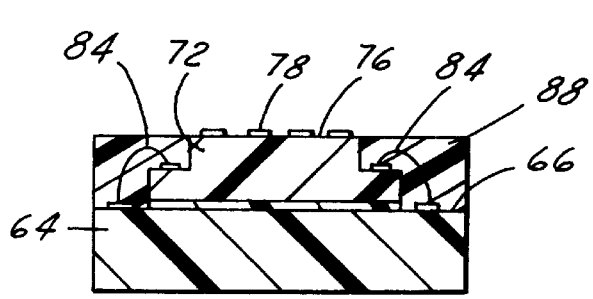
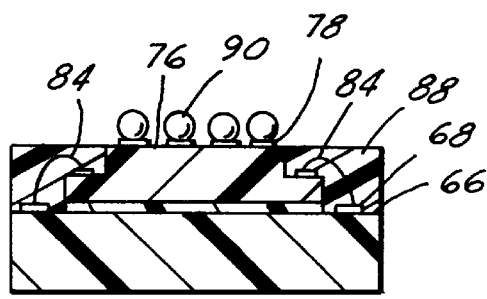
FIG. 4D        FIG. 4E
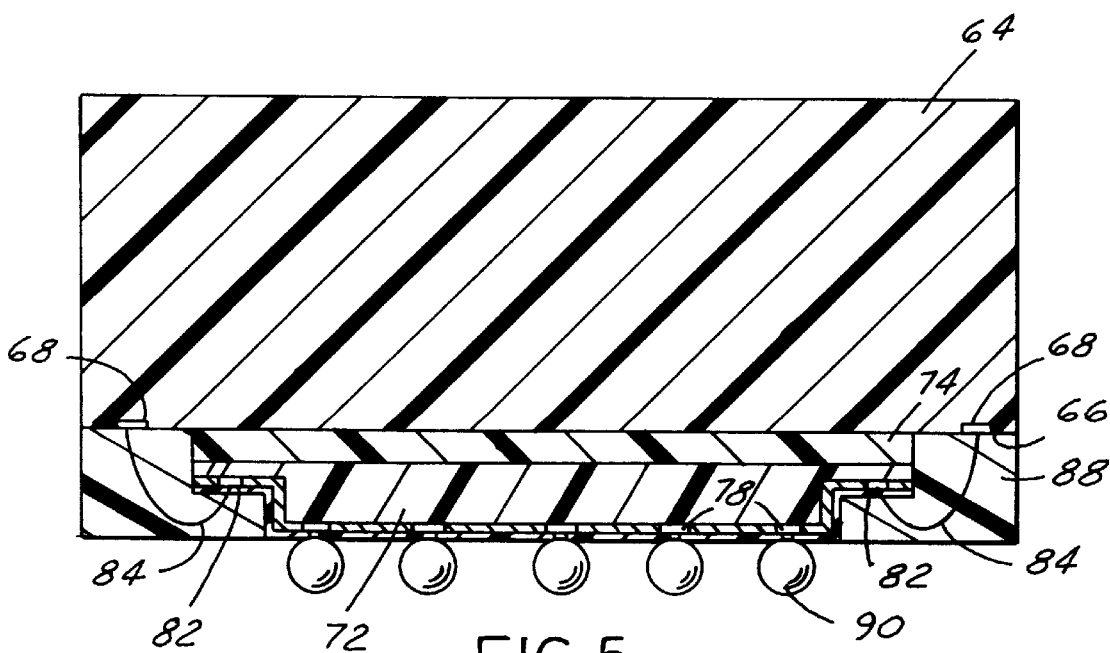
FIG. 5

METHOD FOR WIRE BONDING A CHIP TO A SUBSTRATE WITH RECESSED BOND PADS AND DEVICES FORMED

FIELD OF THE INVENTION

The present invention generally relates to a method for forming chip scale packages and devices formed and more particularly, relates to a method for forming chip scale packages wherein an IC chip is bonded in a face-down position to an interposer along a recessed peripheral edge of the interposer such that only shorter bonding wires are needed to facilitate an encapsulation process for protecting the chip scale package and devices formed by such method.

BACKGROUND OF THE INVENTION

In recent years, ball grid array (BGA) packages for semiconductor chips have been used extensively in the semiconductor industry. BGA packages utilize solder balls for establishing electrical interconnections between a chip and a printed circuit board (PCB) and provide high quality and reliability. It has been commonly used in CPU chips in personal computers, in chips of multi-chip modules and in other high I/O chips.

A BGA package can be made more compact in size than other packages, for instance, than a plastic quad flat package (PQFP). A BGA package which has an IC chip wire bonded to a substrate can be easily soldered to a printed circuit board by solder balls which are arranged in an area array. Other benefits can also be achieved by the BGA package. For instance, there are fewer soldering defects in a BGA assembly when compared to the PQFPs and the self-alignment effect of the solder balls. As a result, minor misalignments in the mounting position can be automatically corrected by the surface tension of the molten solder during a reflow process.

The BGA package utilizes an area array external electrodes which are normally formed of lead/tin solder balls. The solder balls are placed on a back surface of the package at spacings between about 1 mm and about 1.5 mm. The BGA package further provides the benefits of higher external pin-count density, larger thermal paths to the package surroundings and improved pre-testability.

A typical BGA package 10 is shown in FIG. 1 in an enlarged, cross-sectional view. The package 10 is constructed by first bonding an IC die 12 to a substrate 14 by an adhesive layer 28 and then making electrical connections between the two by wire bonds 16. The IC die 12 is typically interconnected to a plastic resin molded substrate 14 in a transfer molding process. Solder balls 20 are then attached to the backside 18 of the substrate 14 in a post-molding operation. A plastic molding compound or encapsulant 24 is utilized in the transfer molding process to encapsulate the IC die 12 and the bonding wires 16 with a top surface 22 of the substrate. Inside the substrates 14 and 18, is a double-sided printed wiring board (PWB) 30 which has copper laminated to both sides of an insulating plastic material. Via holes 26 are drilled and filled with a conductive metal, i.e., electroless copper, followed by a platform plating process. In more sophisticated BGA package structures, multi-layer substrates which have broader power planes or ground planes, or both are utilized for low inductance and larger thermal-path connections.

Solder balls 20 may be formed on the bottom side 18 of the double-sided PWB 30 by a variety of techniques which include solder-ball attachment and solder-paste screen printing. After the solder balls are formed, a reflow operation usually follows to complete the metallurgical connections.

The BGA package 10 shown in FIG. 1 is formed by a conventional chip scale package technique utilizing wire bonding and plastic encapsulation. The IC chip is mounted in a face-up position with the aluminum bonding pads 32 facing upwardly. In such a position, not only the bonding wires 16 leading from the aluminum bonding pads 32 to the upper copper lead 34 in the PWB 30 need to be excessively long, but also the problem of wire sweep may occur during the plastic molding process. The wire sweep problem causes wire breakage or otherwise defective wire bonds.

In a more recently developed BGA package 40, also known as a micro-BGA package shown in FIG. 2, an IC chip 42 is first bonded to a tape 44 which contains the elastomer 56. After the inner lead bonding process where gold lead 46 is bonded to the IC chip pad 48, solder balls 52 are formed on the TAB tape 44 for making connections with the lead fingers 46 and subsequently with the IC chip 42. The handling of the flexible TAB tape 44 and the lead fingers 46 is problematic and frequently cause processing difficulties. In the final stage of the process, a liquid epoxy molding compound 54 is sequentially injected into a mold in which the chip 42 and the tape 44 are positioned to encapsulate the package 40. In the micro-BGA structure 40, the fabrication process is complicated since the alignment between the IC chip 42, the lead fingers 46 and the TAB tape 44 must be precisely controlled, the packaging process can only be carried out at a high cost.

It is therefore desirable to form a chip scale package by a wire bonding method, instead of a inner lead bonding method. The wire bonding technique is well established and the tooling for carrying out such bonding process is readily available. However, as shown by the conventional wire bonded structure of FIG. 1, the length of the wire bond is long which requires a long fabrication time. Furthermore, a wire sweep problem during encapsulation can be caused by the long bonding wires.

It is therefore an object of the present invention to provide a method for forming chip scale packages that does not have the drawbacks or shortcomings of the conventional wire bonding method for forming such packages.

It is another object of the present invention to provide a method for forming chip scale packages that utilizes an established method of wire bonding and readily available wire bonding tools.

It is a further object of the present invention to provide a method for forming chip scale packages that uses shortened bonding wires such that the process time can be reduced.

It is another further object of the present invention to provide a method for forming chip scale packages by utilizing a wire bonding technique with shortened bonding wires such that the wire sweep problem during a plastic encapsulation process can be alleviated.

It is still another object of the present invention to provide a method for forming chip scale packages by utilizing a wire bonding method in which an IC chip is bonded in a face-down position to interconnections on an insulating substrate.

It is yet another object of the present invention to provide a method for forming chip scale packages by utilizing a wire bonding technique in which an insulating substrate having a recessed peripheral area equipped with interconnections is used.

It is still another further object of the present invention to provide a method for forming chip scale packages by a wire bonding technique by first bonding an active surface of an IC chip to an interposer by adhesive means.

It is yet another further object of the present invention to provide a chip scale package that includes an IC chip which is bonded in a face-down position to an interposer, an interposer that is equipped with a recessed peripheral region and shortened bonding wires required for bonding the IC chip to the interposer.

SUMMARY OF THE INVENTION

The present invention discloses a method for forming chip scale packages by utilizing a wire bonding technique and packages formed by such method.

In a preferred embodiment, a method for molding chip scale packages can be carried out by the operating steps of providing an IC chip which has a first plurality of bond pads formed on a top surface along at least one peripheral edge, providing an insulating substrate which has a second plurality of interconnections in a top surface and a third plurality of interconnections in a surface along a peripheral edge recessed from the top surface, the insulating substrate has a bottom surface smaller than the top surface of the IC chip, bonding the bottom surface of the insulating substrate to the top surface of the IC chip with the first plurality of bond pads exposed, wire bonding the first plurality of bond pads to the third plurality of interconnections by a first plurality of bonding wires, encapsulating the IC chip, the insulating substrate and the bonding wires in an insulating material while exposing substantially the second plurality of interconnections, and planting a second plurality of solder balls on the second plurality of interconnections.

The method for forming chip scale packages may further include the step of bonding the second plurality of solder balls to a printed circuit board. The method may further include the step of providing an IC chip which has a first plurality of bond pads formed on a top surface along two oppositely positioned peripheral edges. The insulating substrate may be an interposer. The top surface of the IC chip may be the active surface. The top surface of the IC chip may be positioned juxtaposed to the insulating substrate. The third plurality of interconnections on the insulating substrate may be positioned in a stepped surface along a peripheral edge of the insulating substrate. The method may further include the step of encapsulating the IC chip, the insulating substrate and the bonding wires in a polymeric insulating material.

The present invention is further directed to a chip scale package which includes an IC chip that has a first plurality of bond pads formed on a surface along at least one peripheral edge, an insulating substrate which has a second plurality of interconnections in a top surface and a third plurality of interconnections in a surface along a peripheral edge recessed from the top surface, the insulating substrate may have a bottom surface smaller than the top surface of the IC chip. The bottom surface of the insulating substrate may be bonded to the top surface of the IC chip with the first plurality of bond pads exposed, a first plurality of conductive wires bonding the first plurality of bond pads to the third plurality of interconnections, an insulating material encapsulating the IC chip, the insulating substrate and the bonding wires with the second plurality of interconnections exposed, and a second plurality of solder balls planted on the second plurality of interconnections.

The chip scale package may further include a printed circuit board which is bonded to the second plurality of solder balls on the insulating substrate. The IC chip may have a first plurality of bond pads formed on a top surface along two oppositely positioned peripheral edges. The insulating substrate may be an interposer. The top surface of the IC chip may be the active surface.

The chip scale package may have a top surface of the IC chip that is bonded immediately adjacent to the insulating substrate. The surface on the insulating substrate along a peripheral edge recessed from the top surface may be a stepped surface. The IC chip that is bonded to the insulating substrate by the first plurality of bonding wires in a faced-down position. The insulating substrate may have a stepped top surface with a smaller thickness along a peripheral edge of the insulating substrate. The second plurality of interconnections in the top surface of the insulating substrate are formed by a copper trace layer. The first plurality of bonding wires may be formed of gold. The first plurality of bond pads on the top surface of the IC chip may be formed of aluminum.

BRIEF DESCRIPTION OF THE DRAWINGS

Other objects, features and advantages of the present invention will become apparent upon consideration of the specification and the appended drawings, in which:

FIG. 4B is an enlarged, cross-sectional view of a present invention IC chip bonded in an active surface to an insulating substrate.

FIG. 4C is an enlarged, cross-sectional view of the present invention structure of FIG. 4B with bonding wires connecting the IC chip to the insulating substrate.

FIG. 4D is an enlarged, cross-sectional view of the present invention structure of FIG. 4C having a plastic encapsulating compound molded around the IC chip, the insulating substrate and the wire bonds.

FIG. 4E is an enlarged, cross-sectional view of the present invention structure of FIG. 4D having solder balls formed on the interconnection pads equipped on the insulating substrate.

FIG. 5 is an enlarged, cross-sectional view of the present invention structure similar to that shown in FIG. 4E but in a face-down position.

DETAILED DESCRIPTION OF THE PREFERRED EMBODIMENT

The present invention discloses a method for forming chip scale packages by a wire bonding method wherein an IC chip is bonded in a face-down position to an interposer with the active surface of the IC chip facing the interposer. The interposer is provided with a recessed peripheral edge equipped with interconnections such that shortened wire bonds can be used to bond the IC chip to the interposer. The shortened wire bonds not only reduce the process time required to form the wire bond, but also alleviate the problem of wire sweep during a subsequent plastic encapsulation process.

The insulating substrate, or the interposer is provided with two bonding surfaces. A first bonding surface is the top planar surface of the interposer which consists of a plurality of bonding pads formed of copper traces. After an IC chip is bonded to the interposer, a plurality of solder balls may be formed on the copper traces. A second bonding surface is provided in a recessed portion along a periphery of the insulating substrate. The recessed peripheral surface is further provided with a plurality of interconnections for bonding to the IC chip through the aluminum bond pads along a peripheral edge of the chip.

It should be noted that the term "face-down" used in describing the IC chip is used to describe its position in relation to the insulating substrate (or the interposer) that the chip is bonded to. In other words, the term "face-down" merely means that the active surface of the IC chip is bonded face-to-face with the backside of the interposer. This is clearly shown in FIGS. 4C and 5.

The present invention provides the benefit of a shorter wire bonding time since a shorter wire bond is required than that normally used in a conventional wire bonding process. Furthermore, due to the shorter wire bond, the problem of wire sweep frequently occurring in a plastic encapsulation process can also be alleviated. The present invention novel method further provides the benefit that a well established wire bonding technology can be utilized and that readily available wire bonding tools can be used.

Figure 1:
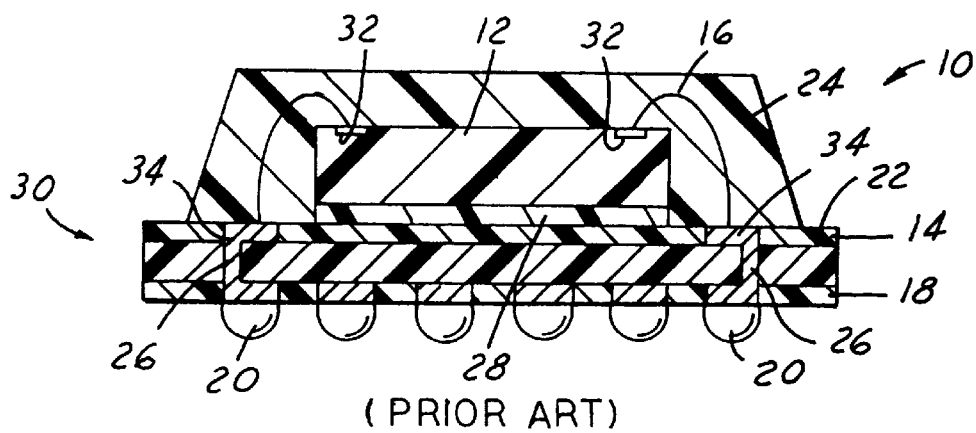
FIG. 1 is an enlarged, cross-sectional view of a conventional BGA package formed on a double-sided printed wiring board.
Figure 2:
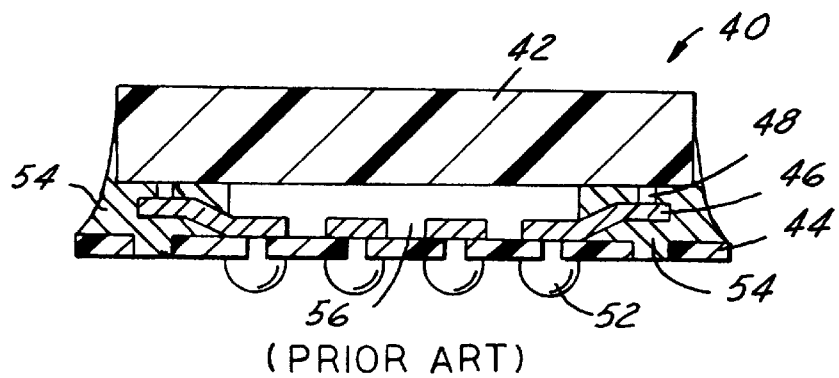
FIG. 2 is an enlarged, cross-sectional view of a micro-BGA package that is encapsulated in insulating materials.
Figure 3:
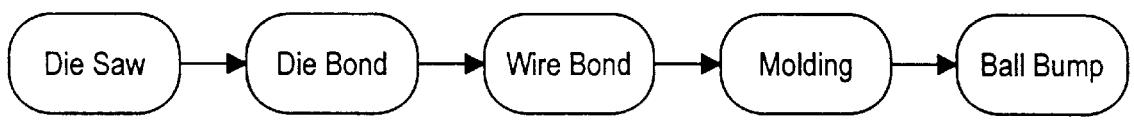
FIG. 3 is a graph of a flow chart illustrating the present invention fabrication process.
Figure 4A:
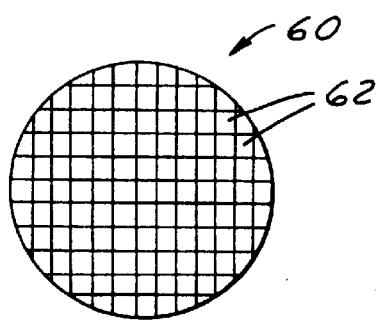
FIG. 4A is a plane view of a present invention wafer having various IC dies scribed on a top surface.

The present invention novel method is illustrated in FIG. 3, a process flow chart and in FIGS. 4A–4E corresponding to the various steps shown in FIG. 3. Referring now to FIG. 3 wherein the present invention novel method is shown in five major processing steps, i.e., die saw, die bond, wire bond, molding and ball bumping. In the first step of die saw, a semiconductor wafer which is fully processed for forming various IC circuits on the chips is scribed and separated in a die saw process into a multiplicity of IC dies. This is also shown in FIG. 4A where wafer 60 is scribed into a multiplicity of IC dies 62. In the next step of the process of die bond, also shown in FIG. 4B, an IC die or chip 64 is bonded in its active surface 66 which contains bond pads 68 along a peripheral edge 70 of the IC die 64. The bonding with an insulating substrate 72 is achieved by an adhesive layer 74. For use in the present invention novel method, it is more preferable that bond pads 68 are formed along oppositely positioned peripheral edges 70 on the die 64 such that bond pads 68 are still exposed after bonding with the insulating substrate 72. The adhesive 74 used in bonding the IC die 64 with the insulating substrate 72 may be any suitable adhesive that is normally used in the semiconductor process industry.

The insulating substrate 72 may be an interposer board or any other suitable substrates. To carry out the present invention novel method, it is preferred that the insulating substrate be constructed in a stepped structure such as that shown in FIG. 4B. The stepped structure of the interposer is constructed with a planar top surface 76 equipped with a plurality of interconnections 78 and a recessed surface 80 equipped with a plurality of interconnections 82. The recessed surface 80 shown in FIG. 4B is arranged along at least two oppositely positioned peripheral regions of the interposer 72. The stepped structure of the interposer 72 enables connections with the IC die 64 to be made, as shown in FIG. 4C in the next wire bonding step, on the recessed level 80, while connections to be made with the outside circuit through interconnections 78 positioned on the top planar surface 76 of the interposer 72.

The bonding between the interposer 72 and the IC die 64 is achieved by bond wires 84 as shown in FIG. 4C. One of the advantages achieved by the present invention is immediately obvious from an observation of FIG. 4C which shows that the bond wires 84 required for bonding the interposer 72 to the IC die 64 is significantly shorter than that normally required when the bond wires are run to the top surface 76 of the interposer 72. It should be noted that the interconnections 78 provided on the top planar surface 76 of the interposer 72 is only used for connecting to outside circuits such as those on a printed circuit board (not shown).

In the next process step of the present invention novel method, as shown in FIGS. 3 and 4D, a plastic molding or encapsulation process is carried out. The process can be advantageously carried out in an enclosed molding apparatus wherein the interposer 72, the bonding wires 84 and the top surface 66 of the IC die 64 are covered by a plastic molding compound 88. A suitable plastic molding compound may be an epoxy composition which has high thermal endurance. It is to be noted that the top planar surface 76 of the interposer 72 is exposed and not covered by the epoxy molding compound 88 such that the multiplicity of interconnections 78 are exposed.

In the final step of the process, as shown in FIG. 3 and FIG. 4E, a multiplicity of solder balls 90 are formed on the interconnections 78. The solder balls 90 may be formed by one of a variety of techniques including, but not limited to, electroless copper plating. The solder balls 90 are first deposited and then reflown to form the balls as shown in FIG. 4E.

A more detailed, cross-sectional view of the present invention structure, similar to that shown in FIG. 4E is shown in FIG. 5. It should be noted that the IC chip 64 is shown in a face-down position with the active surface 66 bonded to the interposer 72 while exposing the interconnections 68 such that bond wires 84 may be formed between the interconnections 68 and the interconnections 82.

The present invention novel method and devices formed by such method are thus fully exemplified in the above descriptions and in the appended drawings of FIGS. 3, 4A–4E and 5.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A method for forming chip scale packages comprising the steps of:

providing an IC chip having a first plurality of bond pads formed on a top surface along at least one peripheral edge, providing an insulating substrate having a second plurality of interconnections in a top surface and a third plurality of interconnections in a surface along a peripheral edge recessed from said top surface, said insulating substrate having a bottom surface smaller than said top surface of said IC chip, bonding said bottom surface of said insulating substrate to said top surface of the IC chip with said first plurality of bond pads exposed, wire bonding said first plurality of bond pads to said third plurality of interconnections by a first plurality of bonding wires, encapsulating said IC chip, said insulating substrate and said bonding wires in an insulating material while exposing substantially said second plurality of interconnections, and planting a first plurality of solder balls on said second plurality of interconnections.

2. A method for forming chip scale packages according to claim 1 further comprising the step of bonding said second plurality of solder balls to a printed circuit board.

3. A method for forming chip scale packages according to claim 1 further comprising the step of providing an IC chip having a first plurality of bond pads formed on a top surface along two oppositely positioned peripheral edges.

4. A method for forming chip scale packages according to claim 1, wherein said insulating substrate is an interposer.

5. A method for forming chip scale packages according to claim 1, wherein said top surface of said IC chip is an active surface.

6. A method for forming chip scale packages according to claim 1, wherein said top surface of said IC chip is positioned adjacent to said insulating substrate.

7. A method for forming chip scale packages according to claim 1, wherein said third plurality of interconnections on said insulating substrate is positioned in a stepped surface along a peripheral edge of said insulating substrate.

8. A method for forming chip scale packages according to claim 1 further comprising the step of encapsulating said IC chip, said insulating substrate and said bonding wires in a polymeric material.

* * * * *